(12) United States Patent  (10) Patent No.: US 11,527,692 B2
Ohta et al.  (45) Date of Patent: Dec. 13, 2022

(54) THERMOELECTRIC CONVERSION MATERIAL AND THERMOELECTRIC CONVERSION MODULE (71) Applicant: NATIONAL INSTITUTE OF ADVANCED INDUSTRIAL SCIENCE AND TECHNOLOGY, Tokyo (JP)

(72) Inventors: Michihiro Ohta, Ibaraki (JP); Yuta Kikuchi, Ibaraki (JP); Yohan Bouyrie, Ibaraki (JP); Koichiro Suekuni, Hiroshima (JP); Toshiro Takabatake, Hiroshima (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 1008 days.

(21) Appl. No.: 16/308,748

(22) PCT Filed: May 25, 2017

(86) PCT No.: PCT/JP2017/019482
§ 371 (c)(1),
(2) Date: Dec. 10, 2018

(87) PCT Pub. No.: WO2017/212926
PCT Pub. Date: Dec. 14, 2017

(65) Prior Publication Data
US 2019/0148613 A1 May 16, 2019

(30) Foreign Application Priority Data
Jun. 10, 2016 (JP) .............................. JP2016-115935

(51) Int. Cl.
H01L 35/16 (2006.01)
C01G 33/00 (2006.01)
C01G 35/00 (2006.01)
H01L 35/32 (2006.01)

(52) U.S. Cl.
CPC ............ *H01L 35/16* (2013.01); *C01G 33/006* (2013.01); *C01G 35/006* (2013.01); *H01L 35/32* (2013.01); *C01P 2006/32* (2013.01); *C01P 2006/40* (2013.01)

(58) Field of Classification Search
CPC ....... H01L 35/16; H01L 35/32; C01G 33/006; C01G 35/006; C01P 2006/32; C01P 2006/40
See application file for complete search history.

(56) References Cited

FOREIGN PATENT DOCUMENTS

JP 2016-039372 A 3/2016

OTHER PUBLICATIONS

English Translation of JP 2016039372 (Year: 2016).*

(Continued)

*Primary Examiner* — Andrew J. Oyer
(74) *Attorney, Agent, or Firm* — Michael Best & Friedrich LLP

(57) ABSTRACT

To provide a thermoelectric conversion material having low environmental load and an excellent thermoelectric figure of merit ZT and a thermoelectric conversion module including the thermoelectric conversion material. A thermoelectric conversion material of the present invention is characterized by being a compound represented by Chemical Formula (1).

$$Cu_{26-x}M_xA_2E_{6-y}S_{32} \qquad (1)$$

In Chemical Formula (1), M represents a metal material including at least one of Mn, Fe, Co, Ni, and Zn; A represents a metal material including at least one of Nb and Ta; E represents a metal material including at least one of Si, (Continued)

Ge, and Sn; x represents a numerical value of 0 or more and 4 or less; and y represents a numerical value of more than 0 and 1 or less.

14 Claims, 1 Drawing Sheet

(56) References Cited

OTHER PUBLICATIONS

Koichiro Suekuni et al., "High-performance thermoelectric minerals: Colusites $Cu_{26}V_2M_6S_{32}$ (M=Ge, Sn)", Applied Physics Letters 105, Sep. 2014, pp. 132107-1-132107-4, vol. 105, Issue 13, American Institute of Physics, USA.

Koichiro Suekuni et al., "Tunable electronic properties and low thermal conductivity in synthetic colusites $Cu_{26-x}Zn_xV_2M_6S_{32}$ (x≤4, M=Ge, Sn)", Journal of Applied Physics 116, Aug. 2014, pp. 063706-1-063706-5, vol. 116, Issue 6, American Institute of Physics, USA.

Fiseong S. Kim et al., "Tuning the charge carrier density in the thermoelectric colusite", Journal of Applied Physics 119, May 2016, pp. 175105-1-175105-4, vol. 119, Issue 17, American Institute of Physics, USA.

International Search Report issued in Application No. PCT/JP2017/019482, dated Aug. 8, 2017.

\* cited by examiner

THERMOELECTRIC CONVERSION MATERIAL AND THERMOELECTRIC CONVERSION MODULE

TECHNICAL FIELD

The present invention relates to a thermoelectric conversion material having an excellent thermoelectric figure of merit ZT and a thermoelectric conversion module including the thermoelectric conversion material.

BACKGROUND ART

Thermoelectric conversion is a technique using a solid thermoelectric conversion element to interconvert thermal energy and electric energy.

The technique converting thermal energy to electric energy is called thermoelectric power generation and is based on the Seebeck effect, one of the thermoelectric effects. In the thermoelectric power generation, a temperature difference across a thermoelectric conversion material is directly converted to electric energy. By using the thermoelectric power generation, huge unused thermal energy emitted from factories and automobiles can be recovered to generate electric power, and this can greatly contribute to the reduction in consumption amount of fossil fuel, that is, $CO_2$ reduction and energy conservation.

Meanwhile, the conversion from electric energy to thermal energy is based on the Peltier effect, another thermoelectric effect, and is applied to cooling or precise temperature control. In the description, the conversion from electric energy to thermal energy based on the Peltier effect will be called Peltier cooling. The Peltier cooling uses a phenomenon in which when an electric current is applied to a thermoelectric conversion material, one edge of the thermoelectric conversion material is cooled. The Peltier cooling has advantages of elimination of refrigerants such as CFC gas for cooling and of precise control of cooling temperatures based on current control.

The thermoelectric power generation and the Peltier cooling typically use an arch-shaped thermoelectric conversion module in which a P-type thermoelectric conversion material (carriers carrying charges are positive holes) and an N-type thermoelectric conversion material (carriers carrying charges are electrons) are connected thermally in parallel and electrically in series through junction electrodes.

A performance of the thermoelectric conversion material can be represented by thermoelectric figure of merit ZT, which is expressed as $ZT=S^2T/\rho\kappa$. In the expression, S represents the Seebeck coefficient of the thermoelectric conversion material, T represents an absolute temperature, $\rho$ represents the electrical resistivity of the thermoelectric conversion material, and $\kappa$ represents the thermal conductivity of the thermoelectric conversion material.

A material having a higher thermoelectric figure of merit ZT has higher conversion efficiency between thermal energy and electric energy, and such a thermoelectric conversion material is considered to have good performance. In other words, if the conversion efficiency is increased, the thermoelectric conversion can be used to extract much more electric power from unused thermal energy or to suppress power consumption for cooling.

As the P-type thermoelectric conversion material, a "colusite" having the chemical composition represented by $Cu_{26-x}M_xA_2E_6S_{32}$ (where M represents a metal material including at least one of Mn, Fe, Co, Ni, and Zn; A represents a metal material including at least one of V, Nb, and Ta; E represents a metal material including at least one of Si, Ge, and Sn; and x represents a numerical value of 0 to 5) is disclosed (see Patent Document 1, Non-Patent Document 1, Non-Patent Document 2).

The colusite shows a large thermoelectric figure of merit ZT of up to 0.73 at 390° C. and mainly contains copper (Cu) and sulfur (S), which have low toxicity and are contained in large amounts in the earth's crust, and thus is suitable as an environmentally friendly thermoelectric conversion material.

Hence, if the colusite has a higher thermoelectric figure of merit ZT and accordingly has higher conversion efficiency, more useful thermoelectric conversion materials and thermoelectric conversion modules can be provided.

As a method of improving the thermoelectric figure of merit ZT of the colusite, a method of introducing Sn defect to a colusite of $Cu_{26}V_2Sn_6S_{32}$ as the fundamental composition is disclosed (see Non-Patent Document 3). According to the disclosure, $Cu_{26}V_2Sn_{5.5}S_{32}$ with Sn defect has a thermoelectric figure of merit ZT of 0.62 at 387° C., whereas $Cu_{26}V_2Sn_6S_{32}$ without Sn defect has a thermoelectric figure of merit ZT of 0.56.

However, the improvement effect on thermoelectric figure of merit ZT by introduction of Sn defect to $Cu_{26}V_2Sn_6S_{32}$ is only 0.06, and the above disclosure has not significantly improved the thermoelectric figure of merit ZT of the colusite. In addition, the above disclosure has failed to give a colusite having a thermoelectric figure of merit ZT equal to the value of the conventionally known colusite (ZT=0.73, see Patent Document 1).

PRIOR ART DOCUMENTS

Patent Document

Patent Document 1: JP 2016-039372 A

Non-Patent Documents

Non-Patent Document 1: K. Suekuni, F. S. Kim, H. Nishiate, M. Ohta, H. I. Tanaka, and T. Takabatake, "High-performance thermoelectric minerals: Colusites Cu26V2M6S32 (M=Ge, Sn)", Applied Physics Letters, 105, 132107: pages 1 to 4, October 2014.

Non-Patent Document 2: K. Suekuni, F. S. Kim, and T. Takabatake, "Tunable electronic properties and low thermal conductivity in synthetic colusites Cu26-xZnxV2M6S32 (M=Ge, Sn)", Journal of Applied Physics, 116, 063706: pages 1 to 5, August 2014.

Non-Patent Document 3: F. S. Kim, K. Suekuni, H. Nishiate, M. Ohta, H. I. Tanaka, T. Takabatake, "Tuning the charge carrier density in the thermoelectric colusite", Journal of Applied Physics, 119, 175105: pages 1 to 5, May 2016.

SUMMARY OF THE INVENTION

Problems to be Solved by the Invention

The present invention is intended to solve the above various problems in related art and to provide a thermoelectric conversion material having low environmental load and an excellent thermoelectric figure of merit ZT and a thermoelectric conversion module including the thermoelectric conversion material.

The inventors of the present invention have conducted intensive studies in order to solve the problems and have obtained the following findings.

The valence numbers of elements in ionic states contained in $Cu_{26}V_2Sn_6S_{32}$ are $Cu^+$, $V^{5+}$, $Sn^{4+}$, and $S^{2-}$. Accordingly, the valence number of the colusite in the fundamental composition (the total sum of valence numbers of elements contained in the colusite) is −4, and in the colusite, positive holes having positive charges are dominant as the carrier for electrical conduction.

When Sn defect is introduced to the colusite having the fundamental composition, a resulting colusite has a smaller valence number and exhibits more metallic electric properties. In other words, such a colusite is supposed to have a smaller electrical resistivity ρ and a higher thermoelectric figure of merit ZT.

A method of introducing Sn defect (see Non-Patent Document 3) has been intended to improve the thermoelectric figure of merit ZT on such a supposition, but the introduction of Sn defect gives such a small effect on improvement in the thermoelectric figure of merit ZT as to be slightly observed, and gives insufficient effect.

Commonly, elements belonging in the same group in the periodic table have the same ionic state, thus even when a homologous element, Nb or Ta, is selected in place of V in $Cu_{26}V_2Sn_6S_{32}$, a resulting colusite still has the same valence number, and the thermoelectric figure of merit ZT is not supposed to be greatly improved.

However, studies by the inventors of the present invention indicate that when Nb, a homologous element, is selected in place of V in $Cu_{26}V_2Sn_6S_{32}$, and Sn defect is introduced to give $Cu_{26}Nb_2Sn_{5.5}S_{32}$, the thermoelectric figure of merit ZT far exceeds an expected value and reaches 0.78 under a temperature environment at 389° C., for example.

The highest thermoelectric figure of merit ZT of the conventionally known colusites is 0.73, and thus the thermoelectric figure of merit ZT of 0.78 indicates that the thermoelectric conversion material represented by $Cu_{26}Nb_2Sn_{5.5}S_{32}$ has the best performance in the world at this stage. $Cu_{26}Nb_2Sn_6S_{32}$ without Sn defect has a thermoelectric figure of merit ZT of about 0.52 at most, and in the case of Nb unlike the case of V, it has been ascertained that the thermoelectric figure of merit ZT is improved by as much as 0.26 when Sn defect is introduced to $Cu_{26}Nb_2Sn_6S_{32}$ as the fundamental composition.

When Ta, a homologous element, is selected in place of V and Sn defect is introduced to give $Cu_{26}Ta_2Sn_{5.5}S_{32}$, it has also been ascertained that the thermoelectric figure of merit ZT is greatly improved as compared with $Cu_{26}Ta_2Sn_6S_{32}$ as the fundamental composition.

As described above, V, Nb, and Ta are homologous elements and thus have the same ionic state. However, Nb having an atomic number of 41 has about twice as large number of electrons as V having an atomic number of 23, and Ta having an atomic number of 73 has about three times as large number of electrons as V. On this account, colusites containing Nb and Ta may differ from a colusite containing V in physical or chemical properties. Although reasons are unclear at the present stage, when Nb and Ta, a homologous element, is selected in place of V, Sn defect leads to a large improvement in thermoelectric figure of merit ZT.

Means for Solving the Problems

The present invention is based on the above findings, and means for solving the problems are as follows.

<1> A thermoelectric conversion material characterized by being a compound represented by the following Chemical Formula (1):

[Formula 1]

$$Cu_{26-x}M_xA_2E_{6-y}S_{32} \quad (1)$$

In Chemical Formula (1), M represents a metal material including at least one of Mn, Fe, Co, Ni, and Zn; A represents a metal material including at least one of Nb and Ta; E represents a metal material including at least one of Si, Ge, and Sn; x represents a numerical value of 0 or more and 4 or less; and y represents a numerical value of more than 0 and 1 or less.

<2> The thermoelectric conversion material according to the above <1>, in which the numerical value represented by x in Chemical Formula (1) is 0.

<3> The thermoelectric conversion material according to the above <1> or <2>, in which the numerical value represented by y in Chemical Formula (1) is more than 0 and 0.5 or less.

<4> The thermoelectric conversion material according to any one of the above <1> to <3>, in which the metal material represented by E in Chemical Formula (1) includes at least one of Sn and Ge.

<5> The thermoelectric conversion material according to any one of the above <1> to <4>, in which the thermoelectric conversion material has a thermoelectric figure of merit ZT of more than 0.73 under a temperature environment of 365° C. to 400° C.

<6> A thermoelectric conversion module characterized by including a thermoelectric conversion material layer formed from the thermoelectric conversion material according to any one of the above <1> to <5>.

Advantageous Effect of the Invention

According to the present invention, a thermoelectric conversion material that can solve the above various problems in related art and has low environmental load and an excellent thermoelectric figure of merit ZT and a thermoelectric conversion module including the thermoelectric conversion material can be provided.

MODE FOR CARRYING OUT THE INVENTION (Thermoelectric Conversion Material)

A thermoelectric conversion material of the present invention is a compound represented by the following Chemical Formula (1).

[Formula 2]

$$Cu_{26-x}M_xA_2E_{6-y}S_{32} \quad (1)$$

In Chemical Formula (1), M represents a metal material including at least one of Mn, Fe, Co, Ni, and Zn; A represents a metal material including at least one of Nb and Ta; E represents a metal material including at least one of Si, Ge, and Sn; x represents a numerical value of 0 or more and 4 or less; and y represents a numerical value of more than 0 and 1 or less.

In Chemical Formula (1), the metal material represented by M is a transition element having a divalent cationic state ($M^{2+}$) and replaces Cu ($Cu^+$) in the compound depending on a numerical value represented by x in Chemical Formula (1).

By this replacement together with the selection of the numerical value represented by y in Chemical Formula (1), the reduction degree of valence number of the compound can be controlled. For example, when x is 0 and y is 0, the compound (where the compound does not include the case of y=0 or the fundamental composition without defect) has a valence number of −4; when x is 0 and y is 1, the compound has a valence number of −8; and when x is 1 and y is 1, the compound has a valence number of −7. By such adjustment of the x value and the y value as above, the valence number of the compound can be easily controlled. As a result, an intended type of the compound can be easily obtained.

To achieve a high thermoelectric figure of merit ZT, the numerical value represented by x in Chemical Formula (1) is preferably 0. The upper limit of x is 4, which is equal to the absolute value of −4 that is the valence number of the compound having the fundamental composition (x=y=0) in which y is 1 from the viewpoint of charge balance.

In Chemical Formula (1), the metal material represented by A is a transition element having a pentavalent cationic state and belonging to group 5 in the periodic table ($A^{5+}$) and is a transition element having a larger number of electrons than that of V as a homologous element.

By selecting A from such transition elements, the thermoelectric figure of merit ZT can be greatly improved when defect is introduced in the composition of the metal material represented by E in Chemical Formula (1) relative to the colusite having the fundamental composition.

In Chemical Formula (1), the metal material represented by E is not limited to Sn but includes Ge and Si that belong to the same group 14 as Sn in the periodic table and have the same ionic state as Sn as long as the thermoelectric conversion material is the compound in which the metal material represented by A in Chemical Formula (1) includes at least one of Nb and Ta.

In Chemical Formula (1), the numerical value represented by y is more than 0 and 1 or less from the viewpoint of a reduction in electrical resistivity ρ to achieve a high thermoelectric figure of merit ZT.

In Chemical Formula (1), the numerical value represented by y is preferably more than 0 and 0.5 or less. In other words, if the numerical value represented by y is set to a comparatively large numerical value of more than 0.5 to reduce the valence number of the compound, the electrical resistivity ρ is reduced and concurrently the Seebeck coefficient S is also comparatively greatly reduced. A reduction in Seebeck coefficient S results in a reduction in thermoelectric figure of merit ZT. Hence, y is more preferably more than 0 and 0.5 or less in order to satisfy both a low electrical resistivity ρ and a high Seebeck coefficient S to achieve a much higher thermoelectric figure of merit ZT.

The thermoelectric conversion material may be produced by any method, and an appropriate method can be selected depending on a purpose.

As an example, in accordance with the composition of the above Chemical Formula (1), the respective elements constituting the compound are weighed, then vacuum sealed in a quartz tube, and heated and melted to synthesize an intended composition. When x is assigned to any value, the compound in which Cu is partially replaced with the metal material represented by M in Chemical Formula (1) is synthesized, whereas when y is assigned to any value, the compound with defect in the metal material represented by E in Chemical Formula (1) is synthesized. A synthesized polycrystalline sample is pulverized and then is subjected to hot press sintering, giving a high-density polycrystal of the compound.

(Thermoelectric Conversion Module)

A thermoelectric conversion module of the present invention includes a thermoelectric conversion material layer formed from the thermoelectric conversion material of the present invention.

The thermoelectric conversion material layer may be formed by any method and can be formed in accordance with a known formation method including the formation methods described in Patent Document 1 and Non-Patent Documents 1 to 3.

The thermoelectric conversion module may be any thermoelectric conversion module that includes the thermoelectric conversion material layer and can have an appropriate structure that is selected from known thermoelectric conversion module structures.

A known thermoelectric conversion module includes a pair of a P-type thermoelectric conversion element formed from a P-type thermoelectric conversion material (carriers carrying charges are positive holes) and an N-type thermoelectric conversion element formed from a N-type thermoelectric conversion material (carriers carrying charges are electrons), and these thermoelectric conversion elements are arranged in an arch shape. A thermoelectric conversion module including a pair of the thermoelectric conversion elements can function, and the thermoelectric conversion module may include a plurality of pairs of the thermoelectric conversion elements from the viewpoint of higher performance.

When the thermoelectric conversion module is formed from a P-type thermoelectric conversion element and an N-type thermoelectric conversion element as above, the thermoelectric conversion module of the present invention includes, as the P-type thermoelectric conversion element, the thermoelectric conversion element including the thermoelectric conversion material layer formed from the thermoelectric conversion material of the present invention in which positive holes having positive charges are dominant as the carrier for electrical conduction. As the N-type thermoelectric conversion element, an appropriate element can be selected from known elements.

The thermoelectric conversion element (the P-type thermoelectric conversion element) including the thermoelectric conversion material layer formed from the thermoelectric conversion material of the present invention may be any thermoelectric conversion element and includes a thermoelectric conversion material layer formed from the thermoelectric conversion material and electrode layers provided in contact with the thermoelectric conversion material layer.

The electrode layer when the thermoelectric conversion material layer is formed from the thermoelectric conversion material of the present invention may be any electrode layer. From the viewpoint of chemical stability against the thermoelectric conversion material layer (colusite), the electrode layer is preferably formed from an electrode material including at least one of Ti, Pt, and Au, and is specifically preferably Au from the viewpoint of lower electric resistance.

The electrode material is not limited to particular materials, and an electrode material produced by a known production method or a commercial product can be used. An electrode material processed into a powder, a foil, a plate, or the like can be used to form the electrode layer.

The thermoelectric conversion element (the P-type thermoelectric conversion element) including the thermoelectric conversion material layer formed from the thermoelectric conversion material of the present invention may be produced by any method and can be formed in accordance with a known formation method including the formation methods described in Patent Document 1 and Non-Patent Documents 1 to 3.

Figure 1:
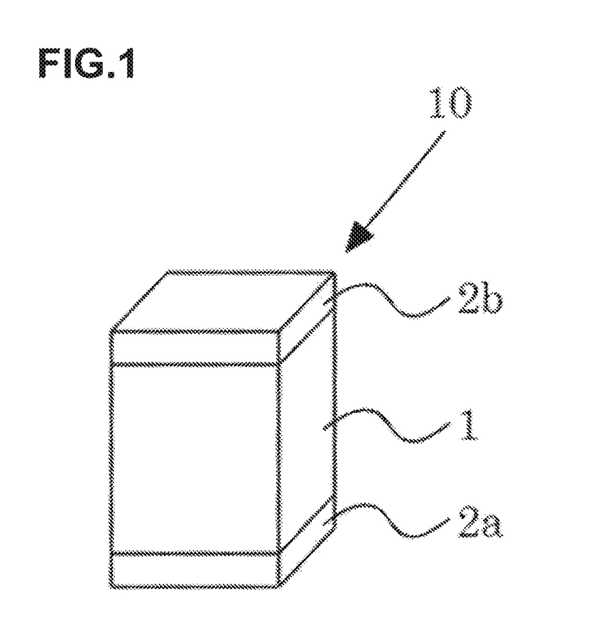
FIG. 1 is a schematic view for illustrating the structure of a thermoelectric conversion element.

An embodiment of the thermoelectric conversion element including the thermoelectric conversion material layer formed from the thermoelectric conversion material of the present invention is shown in FIG. 1. FIG. 1 is a schematic view for illustrating the structure of a thermoelectric conversion element. A thermoelectric conversion element 10 shown in FIG. 1 has substantially the same element structure as a common thermoelectric conversion element.

The thermoelectric conversion element 10 has a structure in which a thermoelectric conversion material layer 1 is interposed between two electrode layers 2a, 2b.

The electrode layers 2a, 2b electrically, thermally connect the thermoelectric conversion material layer 1 to the junction electrodes described later to satisfactory conduct electric current or heat, and have a function of suppressing the reaction between the thermoelectric conversion material layer 1 and the junction electrodes and a function of relaxing the stress between the thermoelectric conversion material layer 1 and the junction electrodes.

Figure 2:
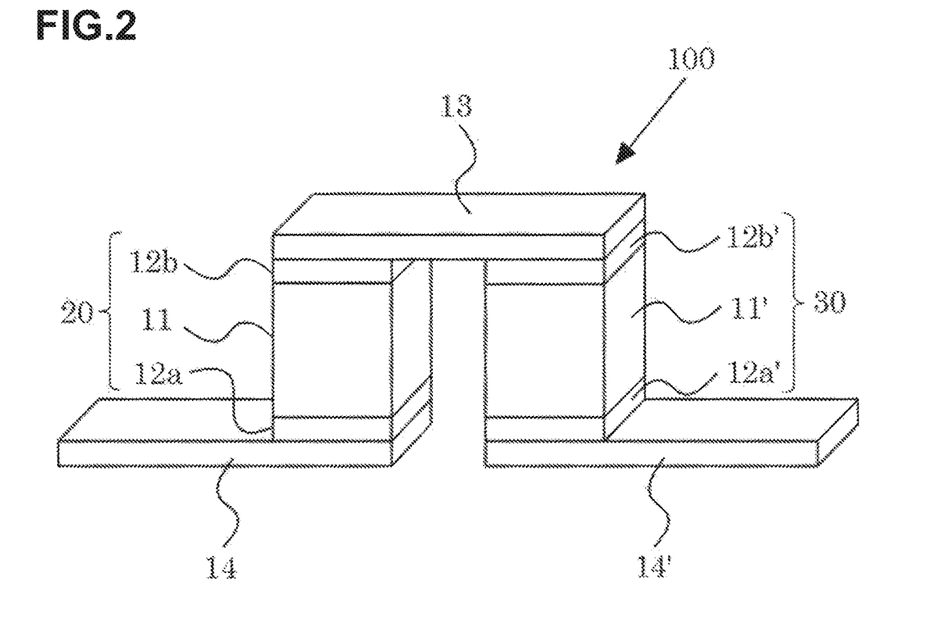
FIG. 2 is a view for illustrating the structure of a thermoelectric conversion module.

Next, an embodiment of the thermoelectric conversion module is shown in FIG. 2. FIG. 2 is a schematic view for illustrating the structure of a thermoelectric conversion module. A thermoelectric conversion module 100 shown in FIG. 2 has substantially the same module structure as a common thermoelectric conversion module.

The thermoelectric conversion module 100 includes two thermoelectric conversion elements of a P-type thermoelectric conversion element 20 including the thermoelectric conversion material of the present invention and an N-type thermoelectric conversion element 30, an upper junction electrode 13 that bridges the upper parts of the two thermoelectric conversion elements, and lower junction electrodes 14, 14' that are on the lower parts of the P-type thermoelectric conversion element 20 and the N-type thermoelectric conversion element 30, respectively, and has an arch shape as a whole, as shown in FIG. 2.

The P-type thermoelectric conversion element 20, as with the thermoelectric conversion element 10, has a structure in which a thermoelectric conversion material layer 11 is interposed between two electrode layers 12a, 12b. As the N-type thermoelectric conversion element 30, a known N-type conversion element can be appropriately selected, and the element has a structure in which a thermoelectric conversion material layer 11' is interposed between two electrode layers 12a', 12b', for example.

The thermoelectric conversion module 100 can be used as a thermoelectric power generation module that causes a potential difference between the lower junction electrodes 14, 14' when the upper junction electrode 13 is at a high temperature and the lower junction electrodes 14, 14' are at a low temperature.

When voltage is applied such that a positive voltage is applied to the lower junction electrode 14' whereas a negative voltage is applied to the lower junction electrode 14, thus electric current is allowed to flow from the lower junction electrode 14' through the module, and the electric current is sent from the lower junction electrode 14, a heat absorption phenomenon is produced in the upper junction electrode 13, and a heat radiation phenomenon is produced in the lower junction electrodes 14, 14'. Hence, the thermoelectric conversion module 100 can be used as a Peltier cooling module that reduces the temperature of a substance in contact with the upper junction electrode 13.

Although the structure of the thermoelectric conversion module of the present invention has been described with reference to FIG. 2, the module structure shown in FIG. 2 is an example structure of the thermoelectric conversion module of the present invention, and structures of other known thermoelectric conversion modules are not excluded.

EXAMPLES

The thermoelectric conversion material of the present invention will next be described with reference to examples. However, the spirit of the present invention is not limited to these examples.

Example 1

First, Cu (1.409 g), Nb (0.159 g), Sn (0.557 g), and S (0.875 g) as raw materials were vacuum sealed in a quartz tube and melted at 1,050° C. to give about 3 g of a polycrystalline sample having a composition of $Cu_{26}Nb_2Sn_{5.5}S_{32}$. The generated phase of the obtained polycrystalline sample was determined by X-ray powder diffraction.

Next, the obtained polycrystalline sample of $Cu_{26}Nb_2Sn_{5.5}S_{32}$ was crushed, and the resulting powder was subjected to hot press sintering to give a thermoelectric conversion material pertaining to Example 1 as a high-density polycrystalline sintered compact.

Comparative Example 1

The same procedure as in Example 1 was performed except that the raw materials were changed from Cu (1.409 g), Nb (0.159 g), Sn (0.557 g), and S (0.875 g) to Cu (1.386 g), Nb (0.156 g), Sn (0.599 g), and S (0.861 g) to give a polycrystalline sample having a composition of $Cu_{26}Nb_2Sn_6S_{32}$, yielding a thermoelectric conversion material pertaining to Comparative Example 1. The generated phase of the obtained polycrystalline sample was determined by X-ray powder diffraction.

The thermoelectric conversion material pertaining to Example 1 was subjected to measurements of Seebeck coefficient S, electrical resistivity ρ, and thermal conductivity κ in a predetermined temperature range (from room temperature to about 400° C.), and the measurement results and the thermoelectric figure of merit ZT calculated from the measurement results are shown in Table 1.

The thermoelectric conversion material pertaining to Comparative Example 1 was subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 2.

TABLE 1

| $Cu_{26}Nb_2Sn_{5.5}S_{32}$ | | | | |
|---|---|---|---|---|
| Temperature [° C.] | Electrical resistivity [μΩm] | Seebeck coefficient [μV · K⁻¹] | Thermal conductivity [W · m⁻¹ · K⁻¹] | Thermoelectric figure of merit ZT |
| 33 | 28 | 118 | 0.67 | 0.22 |
| 79 | 30 | 127 | 0.67 | 0.28 |
| 127 | 31 | 134 | 0.67 | 0.35 |
| 175 | 33 | 145 | 0.66 | 0.42 |

TABLE 1-continued $Cu_{26}Nb_2Sn_{5.5}S_{32}$

| Temperature [° C.] | Electrical resistivity [μΩm] | Seebeck coefficient [μV · K⁻¹] | Thermal conductivity [W · m⁻¹ · K⁻¹] | Thermoelectric figure of merit ZT |
|---|---|---|---|---|
| 223 | 37 | 160 | 0.65 | 0.53 |
| 270 | 41 | 168 | 0.64 | 0.58 |
| 318 | 45 | 181 | 0.64 | 0.68 |
| 365 | 48 | 192 | 0.63 | 0.77 |
| 389 | 51 | 194 | 0.63 | 0.78 |
| 366 | 49 | 191 | 0.63 | 0.75 |
| 318 | 45 | 173 | 0.64 | 0.61 |
| 271 | 43 | 167 | 0.64 | 0.55 |
| 223 | 39 | 154 | 0.65 | 0.46 |
| 176 | 36 | 148 | 0.66 | 0.41 |
| 127 | 33 | 134 | 0.67 | 0.32 |
| 79 | 31 | 121 | 0.67 | 0.25 |

TABLE 2

$Cu_{26}Nb_2Sn_6S_{32}$

| Temperature [° C.] | Electrical resistivity [μΩm] | Seebeck coefficient [μV · K⁻¹] | Thermal conductivity [W · m⁻¹ · K⁻¹] | Thermoelectric figure of merit ZT |
|---|---|---|---|---|
| 34 | 33 | 103 | 0.80 | 0.12 |
| 76 | 35 | 115 | 0.79 | 0.16 |
| 123 | 38 | 128 | 0.77 | 0.22 |
| 171 | 43 | 142 | 0.76 | 0.28 |
| 220 | 47 | 156 | 0.73 | 0.35 |
| 268 | 53 | 163 | 0.71 | 0.38 |
| 316 | 58 | 172 | 0.69 | 0.43 |
| 364 | 63 | 185 | 0.68 | 0.51 |
| 388 | 65 | 188 | 0.68 | 0.52 |
| 364 | 64 | 184 | 0.68 | 0.50 |
| 316 | 59 | 177 | 0.69 | 0.45 |
| 268 | 54 | 162 | 0.71 | 0.37 |
| 220 | 49 | 152 | 0.73 | 0.32 |
| 172 | 45 | 139 | 0.75 | 0.25 |
| 123 | 41 | 129 | 0.77 | 0.21 |
| 77 | 38 | 112 | 0.79 | 0.15 |

As shown in Table 1, the thermoelectric figure of merit ZT of the thermoelectric conversion material pertaining to Example 1 exceeds, in a temperature environment of 365° C. or more, the maximum thermoelectric figure of merit ZT, 0.73, of a colusite described in Patent Document 1, and reaches up to 0.78 in a temperature environment of 389° C. The thermoelectric figure of merit ZT, 0.78, indicates that the thermoelectric conversion material pertaining to Example 1 has the best performance in the world at the present stage.

Table 1 and Table 2 show that the thermoelectric conversion material pertaining to Example 1 in which the metal material represented by A in Chemical Formula (1) is Nb, the metal material represented by E is Sn, and Sn defect is introduced such that the numerical value represented by y (defect amount) is 0.5 has a smaller electrical resistivity ρ and a higher thermoelectric figure of merit ZT than those of the thermoelectric conversion material pertaining to Comparative Example 1 prepared in the same manner except that no Sn defect is introduced. The improvement effect by introduction of Sn defect on thermoelectric figure of merit ZT reaches up to 0.26 when compared in equal temperature conditions, and the thermoelectric conversion material pertaining to Example 1 achieves dramatic improvements in thermoelectric figure of merit ZT as compared with the thermoelectric conversion material pertaining to Comparative Example 1.

The thermoelectric conversion material pertaining to Example 1 with Sn defect has a thermoelectric figure of merit ZT of 0.78, which is about 30% higher than the thermoelectric figure of merit ZT, 0.62, of $Cu_{26}V_2Sn_{5.5}S_{32}$ with Sn defect in Non-Patent Document 3. This indicates that the thermoelectric figure of merit ZT is markedly improved by changing the metal material represented by A in Chemical Formula (1) from V to Nb.

The improvement effect by introduction of Sn defect in the thermoelectric conversion material pertaining to Example 1 on the thermoelectric figure of merit ZT (the thermoelectric figure of merit ZT is improved by 0.26) is as great as 4 times or more the improvement effect by introduction of Sn defect in $Cu_{26}V_2Sn_{5.5}S_{32}$ described in Non-Patent Document 3 on the thermoelectric figure of merit ZT (the thermoelectric figure of merit ZT was improved by 0.06).

Example 2

The same procedure as in Example 1 was performed except that the raw materials were changed from Cu (1.409 g), Nb (0.159 g), Sn (0.557 g), and S (0.875 g) to Cu (1.4414 g), Ta (0.3163 g), Ge (0.3485 g), and S (0.8932 g) to give a polycrystalline sample having a composition of $Cu_{26}Ta_2Ge_{5.5}S_{32}$, yielding a thermoelectric conversion material pertaining to Example 2. The generated phase of the obtained polycrystalline sample was determined by X-ray powder diffraction.

Comparative Example 2

The same procedure as in Example 2 was performed except that the raw materials were changed from Cu (1.4414 g), Ta (0.3163 g), Ge (0.3485 g), and S (0.8932 g) to Cu (1.426 g), Ta (0.313 g), Ge (0.375 g), and S (0.886 g) to give a polycrystalline sample having a composition of $Cu_{26}Ta_2Ge_6S_{32}$, yielding a thermoelectric conversion material pertaining to Comparative Example 2. The generated phase of the obtained polycrystalline sample was determined by X-ray powder diffraction.

The thermoelectric conversion material pertaining to Example 2 was subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 3.

The thermoelectric conversion material pertaining to Comparative Example 2 was also subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 4.

TABLE 3

$Cu_{26}Ta_2Ge_{5.5}S_{32}$

| Temperature [° C.] | Electrical resistivity [μΩm] | Seebeck coefficient [μV · K⁻¹] | Thermal conductivity [W · m⁻¹ · K⁻¹] | Thermoelectric figure of merit ZT |
|---|---|---|---|---|
| 80 | 51 | 147 | 0.53 | 0.28 |
| 129 | 56 | 161 | 0.53 | 0.35 |
| 179 | 61 | 171 | 0.50 | 0.43 |

TABLE 3-continued $Cu_{26}Ta_2Ge_{5.5}S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 228 | 66 | 187 | 0.49 | 0.54 |
| 277 | 72 | 195 | 0.49 | 0.59 |
| 326 | 78 | 213 | 0.48 | 0.72 |
| 375 | 85 | 218 | 0.48 | 0.76 |
| 399 | 88 | 223 | 0.48 | 0.79 |
| 375 | 85 | 217 | 0.48 | 0.74 |
| 326 | 79 | 209 | 0.48 | 0.69 |
| 277 | 72 | 192 | 0.49 | 0.57 |
| 228 | 67 | 183 | 0.49 | 0.51 |
| 179 | 61 | 171 | 0.50 | 0.44 |
| 130 | 55 | 159 | 0.53 | 0.35 |
| 81 | 50 | 149 | 0.53 | 0.29 |

TABLE 4

$Cu_{26}Ta_2Ge_6S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 26 | 60 | 141 | 0.65 | 0.15 |
| 50 | 62 | 151 | 0.65 | 0.18 |
| 75 | 63 | 157 | 0.63 | 0.22 |
| 100 | 65 | 155 | 0.60 | 0.23 |
| 125 | 68 | 165 | 0.57 | 0.28 |
| 150 | 70 | 172 | 0.55 | 0.32 |
| 175 | 73 | 179 | 0.55 | 0.35 |
| 200 | 77 | 184 | 0.55 | 0.38 |
| 225 | 80 | 193 | 0.54 | 0.43 |
| 250 | 82 | 195 | 0.53 | 0.46 |
| 275 | 86 | 201 | 0.52 | 0.49 |
| 300 | 90 | 204 | 0.51 | 0.51 |
| 325 | 94 | 214 | 0.51 | 0.57 |
| 350 | 98 | 215 | 0.51 | 0.58 |
| 375 | 101 | 219 | 0.50 | 0.62 |
| 400 | 105 | 228 | 0.50 | 0.66 |

As shown in Table 3, the thermoelectric figure of merit ZT of thermoelectric conversion material pertaining to Example 2 exceeds the maximum thermoelectric figure of merit ZT, 0.73, of a colusite described in Patent Document 1, and reaches up to 0.79 in a temperature environment of 399° C. The thermoelectric figure of merit ZT, 0.79, indicates that the thermoelectric conversion material pertaining to Example 2 has the best performance in the world at the present stage.

Table 3 and Table 4 show that the thermoelectric conversion material pertaining to Example 2 in which the metal material represented by A in Chemical Formula (1) is Ta, the metal material represented by E is Ge, and Sn defect is introduced such that the numerical value represented by y (defect amount) is 0.5 has a smaller electrical resistivity ρ and a higher thermoelectric figure of merit ZT than those of the thermoelectric conversion material pertaining to Comparative Example 2 prepared in the same manner except that no Sn defect is introduced. The improvement effect by introduction of Sn defect on thermoelectric figure of merit ZT reaches up to 0.13 when compared in equal temperature conditions, and the thermoelectric conversion material pertaining to Example 2 achieves dramatic improvements in thermoelectric figure of merit ZT as compared with the thermoelectric conversion material pertaining to Comparative Example 2.

The thermoelectric conversion material pertaining to Example 2 with Ge defect has a thermoelectric figure of merit ZT of 0.79, which is about 30% higher than the thermoelectric figure of merit ZT, 0.62, of $Cu_{26}V_2Sn_{5.5}S_{32}$ with Sn defect in Non-Patent Document 3. This indicates that the thermoelectric figure of merit ZT is markedly improved by changing the metal material represented by A in Chemical Formula (1) from V to Nb.

The improvement effect by introduction of Ge defect in the thermoelectric conversion material pertaining to Example 2 on the thermoelectric figure of merit ZT (the thermoelectric figure of merit ZT is improved by 0.13) is as great as twice or more the improvement effect by introduction of Sn defect in $Cu_{26}V_2Sn_{5.5}S_{32}$ described in Non-Patent Document 3 on the thermoelectric figure of merit ZT (the thermoelectric figure of merit ZT was improved by 0.06).

Example 3

The same procedure as in Example 1 was performed except that the raw materials were changed from Cu (1.409 g), Nb (0.159 g), Sn (0.557 g), and S (0.875 g) to Cu (1.3209 g), Ta (0.2898 g), Sn (0.5700 g), and S (0.8213 g) to give a polycrystalline sample having a composition of $Cu_{26}Ta_2Sn_{5.5}S_{32}$, yielding a thermoelectric conversion material pertaining to Example 3. The generated phase of the obtained polycrystalline sample was determined by X-ray powder diffraction.

Comparative Example 3

The same procedure as in Example 3 was performed except that the raw materials were changed from Cu (1.3209 g), Ta (0.2898 g), Sn (0.5700 g), and S (0.8213 g) to Cu (1.5638 g), Ta (0.343 g), Sn (0.6198 g), and S (0.9725 g) to give a polycrystalline sample having a composition of $Cu_{26}Ta_2Sn_6S_{32}$, yielding a thermoelectric conversion material pertaining to Comparative Example 3. The generated phase of the obtained polycrystalline sample was determined by X-ray powder diffraction.

The thermoelectric conversion material pertaining to Example 3 was subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 5.

The thermoelectric conversion material pertaining to Comparative Example 3 was also subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 6.

TABLE 5

$Cu_{26}Ta_2Sn_{5.5}S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 26 | 24 | 117 | 0.64 | 0.26 |
| 50 | 25 | 120 | 0.61 | 0.30 |
| 75 | 26 | 126 | 0.63 | 0.34 |
| 100 | 27 | 131 | 0.61 | 0.40 |
| 125 | 27 | 137 | 0.60 | 0.46 |
| 150 | 29 | 147 | 0.60 | 0.52 |
| 175 | 31 | 156 | 0.62 | 0.57 |

TABLE 5-continued $Cu_{26}Ta_2Sn_{5.5}S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 200 | 33 | 155 | 0.60 | 0.58 |
| 225 | 35 | 166 | 0.59 | 0.67 |
| 250 | 37 | 169 | 0.58 | 0.69 |
| 275 | 39 | 172 | 0.58 | 0.72 |
| 300 | 42 | 183 | 0.57 | 0.80 |
| 325 | 44 | 183 | 0.57 | 0.80 |
| 350 | 45 | 186 | 0.56 | 0.84 |
| 375 | 48 | 194 | 0.56 | 0.89 |
| 400 | 54 | 206 | 0.55 | 0.97 |

TABLE 6

$Cu_{26}Ta_2Sn_6S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 25 | 26 | 123 | 0.69 | 0.23 |
| 50 | 27 | 130 | 0.66 | 0.28 |
| 75 | 29 | 135 | 0.67 | 0.30 |
| 100 | 30 | 145 | 0.65 | 0.36 |
| 125 | 32 | 148 | 0.65 | 0.38 |
| 150 | 34 | 153 | 0.64 | 0.41 |
| 175 | 36 | 162 | 0.63 | 0.47 |
| 200 | 37 | 169 | 0.63 | 0.51 |
| 225 | 40 | 177 | 0.63 | 0.56 |
| 250 | 42 | 180 | 0.62 | 0.58 |
| 275 | 45 | 187 | 0.61 | 0.61 |
| 300 | 49 | 194 | 0.61 | 0.65 |
| 325 | 51 | 193 | 0.61 | 0.63 |
| 350 | 53 | 200 | 0.60 | 0.68 |
| 375 | 55 | 208 | 0.59 | 0.76 |
| 400 | 57 | 211 | 0.59 | 0.78 |

As shown in Table 5, the thermoelectric figure of merit ZT of the thermoelectric conversion material pertaining to Example 3 exceeds the maximum thermoelectric figure of merit ZT, 0.73, of a colusite described in Patent Document 1, and reaches up to 0.97 in a temperature environment of 400° C. The thermoelectric figure of merit ZT, 0.97, indicates that the thermoelectric conversion material pertaining to Example 3 has the best performance in the world at the present stage.

Table 5 and Table 6 show that the thermoelectric conversion material pertaining to Example 3 in which the metal material represented by A in Chemical Formula (1) is Ta, the metal material represented by E is Sn, and Sn defect is introduced such that the numerical value represented by y (defect amount) is 0.5 has a smaller electrical resistivity ρ and a higher thermoelectric figure of merit ZT than those of the thermoelectric conversion material pertaining to Comparative Example 3 prepared in the same manner except that no Sn defect is introduced. The improvement effect by introduction of Sn defect on thermoelectric figure of merit ZT reaches up to 0.19 when compared in equal temperature conditions, and the thermoelectric conversion material pertaining to Example 3 achieves dramatic improvements in thermoelectric figure of merit ZT as compared with the thermoelectric conversion material pertaining to Comparative Example 3.

The thermoelectric conversion material pertaining to Example 3 with Sn defect has a thermoelectric figure of merit ZT of 0.97, which is about 50% higher than the thermoelectric figure of merit ZT, 0.62, of $Cu_{26}V_2Sn_{5.5}S_{32}$ with Sn defect in Non-Patent Document 3. This indicates that the thermoelectric figure of merit ZT is markedly improved by changing the metal material represented by A in Chemical Formula (1) from V to Ta.

The improvement effect by introduction of Sn defect in the thermoelectric conversion material pertaining to Example 3 on the thermoelectric figure of merit ZT (the thermoelectric figure of merit ZT is improved by 0.19) is as great as three times or more the improvement effect by introduction of Sn defect in $Cu_{26}V_2Sn_{5.5}S_{32}$ described in Non-Patent Document 3 on the thermoelectric figure of merit ZT (the thermoelectric figure of merit ZT was improved by 0.06).

Example 4

The same procedure as in Example 1 was performed except that the raw materials were changed from Cu (1.409 g), Nb (0.159 g), Sn (0.557 g), and S (0.875 g) to Cu (1.5198 g), Nb (0.1718 g), Ge (0.3678 g), and S (0.9438 g) to give a polycrystalline sample having a composition of $Cu_{26}Nb_2Ge_{5.5}S_{32}$, yielding a thermoelectric conversion material pertaining to Example 4. The generated phase of the obtained polycrystalline sample was determined by X-ray powder diffraction.

The thermoelectric conversion material pertaining to Example 4 was subjected to the same measurements as for the thermoelectric conversion material pertaining to Example 1, and the measurement results of Seebeck coefficient S, electrical resistivity ρ, and thermal conductivity κ and the thermoelectric figure of merit ZT calculated from the measurement results are shown in Table 7.

TABLE 7

$Cu_{26}Nb_2Ge_{5.5}S_{32}$

| Temperature [° C.] | Electrical resistivity [μΩm] | Seebeck coefficient [μV · K$^{-1}$] | Thermal conductivity [W · m$^{-1}$ · K$^{-1}$] | Thermoelectric figure of merit ZT |
|---|---|---|---|---|
| 50 | 44 | 143 | 0.66 | 0.23 |
| 100 | 48 | 155 | 0.64 | 0.29 |
| 150 | 54 | 167 | 0.56 | 0.40 |
| 200 | 60 | 179 | 0.55 | 0.46 |
| 250 | 67 | 188 | 0.54 | 0.52 |
| 300 | 73 | 199 | 0.54 | 0.58 |
| 350 | 79 | 212 | 0.53 | 0.67 |
| 400 | 85 | 222 | 0.53 | 0.73 |

As shown in Table 7, the thermoelectric conversion material pertaining to Example 4 has a maximum thermoelectric figure of merit ZT of 0.73 in a temperature environment of 400° C. This value is equivalent to the maximum thermoelectric figure of merit ZT, 0.73, of a colusite described in Patent Document 1. The thermoelectric conversion material pertaining to Example 4 is the same compound as the thermoelectric conversion material pertaining to Example 1 except that the metal material represented by E in Chemical Formula (1) is changed from Sn to Ge, and this reveals that a high thermoelectric figure of merit ZT is achieved even when the metal material represented by E in Chemical Formula (1) is changed to Ge.

The thermoelectric conversion material pertaining to Example 4 with Ge defect has a thermoelectric figure of merit ZT of 0.73, which is about 20% higher than the thermoelectric figure of merit ZT, 0.62, of $Cu_{26}V_2Sn_{5.5}S_{32}$ with Sn defect in Non-Patent Document 3. This indicates that the thermoelectric figure of merit ZT is markedly improved by changing the metal material represented by A in Chemical Formula (1) from V to Nb.

Reference Example

According to Non-Patent Document 3, a sintered compact of $Cu_{26}V_2Sn_{5.5}S_{32}$ has a thermoelectric figure of merit of 0.62 at 387° C. whereas a sintered compact of $Cu_{26}V_2Sn_6S_{32}$ has a thermoelectric figure of merit of 0.56 at 391° C., and the improvement effect by introduction of Sn defect to $Cu_{26}V_2Sn_6S_{32}$ on the thermoelectric figure of merit ZT is about 0.06. In other words, marked improvements by Sn defect on the thermoelectric figure of merit ZT are not observed in colusites in which the metal material represented by A in Chemical Formula (1) is V.

As described above, even when the metal material represented by A in Chemical Formula (1) is any of V, Nb, and Ta, colusites have the same valence number as a whole. Hence, colusites would have the same thermoelectric figure of merit ZT even when any metal material is selected. However, each thermoelectric conversion material containing Nb or Ta in Examples 1 to 4 has a far higher thermoelectric figure of merit ZT than that of the colusite containing V in Non-Patent Document 3. In addition, each thermoelectric conversion material in Examples 1 to 3 has a higher thermoelectric figure of merit ZT than the record high thermoelectric figure of merit ZT of the thermoelectric conversion material according to Patent Document 1. The thermoelectric conversion materials pertaining to the present invention are contrary to the expectations and have an excellent thermoelectric figure of merit ZT.

REFERENCE SIGNS LIST 1, 11, 11' thermoelectric conversion material layer
2a, 2b, 12a, 12b, 12a', 12b' electrode layer
10 thermoelectric conversion element
20 P-type thermoelectric conversion element
30 N-type thermoelectric conversion element
13 upper junction electrode
14, 14' lower junction electrode
100 thermoelectric conversion module

The invention claimed is:

1. A thermoelectric conversion material being a compound represented by Chemical Formula (1):

[Formula 1]

$$Cu_{26-x}M_xA_2E_{6-y}S_{32} \qquad (1)$$

in Chemical Formula (1), M represents a metal material including at least one selected from a group consisting of Mn, Fe, Co, Ni, and Zn; A represents a metal material including at least one selected from a group consisting of Nb and Ta; E represents a metal material including at least one of selected from Si and Sn; x represents a numerical value of 0 or more and 4 or less; and y represents a numerical value of more than 0 and 1 or less, wherein
the thermoelectric conversion material has a thermoelectric figure of merit ZT more than 0.73 under a temperature environment of 300° C. to 400° C.

2. The thermoelectric conversion material according to claim 1, wherein the numerical value represented by x in Chemical Formula (1) is 0.

3. The thermoelectric conversion material according to claim 1, wherein the numerical value represented by y in Chemical Formula (1) is more than 0 and 0.5 or less.

4. The thermoelectric conversion material according to claim 1, wherein the metal material represented by E in Chemical Formula (1) is Sn.

5. The thermoelectric conversion material according to claim 1, wherein the thermoelectric conversion material has a thermoelectric figure of merit ZT of 0.75 or more under a temperature environment of 300° C. to 400° C.

6. The thermoelectric conversion material according to claim 1, wherein the thermoelectric conversion material has a thermoelectric figure of merit ZT of 0.8 or more under a temperature environment of 300° C. to 400° C.

7. The thermoelectric conversion material according to claim 6, wherein the thermoelectric conversion material has a thermoelectric figure of merit ZT of 0.97 or less under a temperature environment of 300° C. to 400° C.

8. A thermoelectric conversion module comprising:
a thermoelectric conversion material layer formed from the thermoelectric conversion material according to claim 1.

9. A thermoelectric conversion material being a compound represented by Chemical Formula (1):

[Formula 1]

$$Cu_{26-x}M_xA_2E_{6-y}S_{32} \qquad (1)$$

in Chemical Formula (1), M represents a metal material including at least one selected from a group consisting of Mn, Fe, Co, Ni, and Zn; A represents a metal material including at least one selected from a group consisting of Nb and Ta; E represents a metal material including Ge; x represents a numerical value of 0 or more and 4 or less; and y represents a numerical value of more than 0 and 1 or less, wherein
the thermoelectric conversion material has a thermoelectric figure of merit ZT of 0.74 or more under a temperature environment of 375° C. to 400° C.

10. The thermoelectric conversion material according to claim 9, wherein the numerical value represented by x in Chemical Formula (1) is 0.

11. A thermoelectric conversion module comprising:
a thermoelectric conversion material layer formed from the thermoelectric conversion material according to claim 9.

12. The thermoelectric conversion material according to claim 9, wherein the thermoelectric conversion material has a thermoelectric figure of merit ZT of 0.76 or more under a temperature environment of 375° C. to 400° C.

13. The thermoelectric conversion material according to claim 9, wherein the thermoelectric conversion material has a thermoelectric figure of merit ZT of 0.79 or less under a temperature environment of 375° C. to 400° C.

14. The thermoelectric conversion material according to claim 9, wherein the numerical value represented by y in Chemical Formula (1) is more than 0 and 0.5 or less.

* * * * *